(12) United States Patent
Kudoh et al.

(10) Patent No.: US 6,373,714 B1
(45) Date of Patent: Apr. 16, 2002

(54) SURFACE MOUNTING PART

(75) Inventors: Kazuo Kudoh; Masashi Katsumata, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/412,757

(22) Filed: Oct. 5, 1999

(30) Foreign Application Priority Data

Oct. 7, 1998 (JP) .......................................... 10-285766

(51) Int. Cl.⁷ ................................................. H05K 7/02
(52) U.S. Cl. ...................... 361/760; 361/761; 361/743; 361/748; 361/736; 361/763; 361/735; 361/790
(58) Field of Search ................................ 361/720, 736, 361/748, 760, 761, 763, 766, 816, 818, 704, 735, 743, 790; 331/67

(56) References Cited

U.S. PATENT DOCUMENTS

| | | | | |
|---|---|---|---|---|
| 5,742,477 A | * | 4/1998 | Baba ........................... | 361/704 |
| 5,898,344 A | * | 4/1999 | Hayashi ....................... | 331/67 |
| 6,125,039 A | * | 9/2000 | Suzuki ......................... | 361/720 |
| 6,142,831 A | * | 11/2000 | Ashman et al. ............... | 439/620 |

FOREIGN PATENT DOCUMENTS

| JP | 01-146391 | 6/1989 |
|---|---|---|
| JP | 01-191491 | 8/1989 |
| JP | 05-090728 | 4/1993 |
| JP | 05-211280 | 8/1993 |
| JP | 6-104378 | 4/1994 |
| JP | 6-111869 | 4/1994 |
| JP | 6-160183 | 6/1994 |
| JP | 06-164096 | 6/1994 |
| JP | 06-268365 | 9/1994 |

* cited by examiner

*Primary Examiner*—Jeffrey Gaffin
*Assistant Examiner*—Thanh Y. Tran
(74) *Attorney, Agent, or Firm*—Oblon, Spivak, McClelland, Maier & Neustadt, P.C.

(57) ABSTRACT

The present invention is to provide a surface mounting part, capable of corresponding to high density mounting of a mother board and capable of achieving a small size, to be mounted on a mother board by reflow. Electronic parts are mounted on both sides of a printed board. Terminal electrodes of the electronic parts mounted on the rear side are provided as terminals for connecting with the mother board.

11 Claims, 4 Drawing Sheets

SURFACE MOUNTING PART

BACKGROUND OF THE INVENTION

The present invention relates to a surface mounting part (module) having a configuration with electronic parts mounted on a printed circuit board for providing a module, and mounted on a mother board, such as a voltage controlled oscillator, and in particular, it relates to a structure for downsizing a module.

As shown in FIGS. 4A and 4C, conventional voltage controlled oscillators used in mobile communication devices, such as portable phones, comprise a printed board 20 having a multi-layer structure of a conductor and an insulator, elements constituting an oscillator, such as a resonator and a capacitor, formed inside, and a plurality of other electronic parts 21, such as a capacitor, a semiconductor element, mounted on the surface of the printed board 20. Moreover, as shown in FIG. 4B, a shield case 22 is provided so as to cover the electronic part 21 for preventing the noise radiation from the electronic part 22 to the outside and entrance of the noise from the outside. The shield case 22 is fixed by fitting projection pieces 22a, elongating from the lower opening side rim of the shield case 22, to semi-circular arc-like terminals 23, 24 provided on both side surfaces of the printed board 20, and soldering.

As shown in FIG. 4A, terminal electrodes 26 to 31 to serve as a power source terminal, an input terminal, an output terminal and a ground terminal, are formed on the periphery of the printed board 20. The voltage controlled oscillator is fixed by electrically connecting the terminal electrodes 26 to 31 to a pad 34 on a mother board 33 by reflow as shown in FIG. 4C.

Furthermore, as shown in FIG. 4D, the official gazette of JP-A-6-111869 discloses an embodiment comprising a module with electronic parts 39 mounted on the front and rear sides of a printed board 37. The module circuit board (printed board) 37 disclosed in the official gazette is fixed by soldering to a mother board 42 via block-like terminal members 41 comprising a conductor film formed on the periphery of an insulator.

In order to downsize electronic devices, the mother board 33 needs to be downsized. Therefor, the printed board 20, 37 needs to be smaller for downsizing the module. However, the configuration comprising the electronic parts 21 mounted on one side of the printed board 20 involves a problem in that since the number of the electronic parts 21 to be mounted is set to some extent, the size of the printed board 20 is limited and further downsizing of the module is disabled.

On the other hand, if the electronic parts 39 are mounted on the front and rear sides of the printed board 37 as disclosed in the official gazette, the electronic parts 39 are allotted on the front and rear sides, and thus a problem of the mounting space of the electronic parts can be alleviated. However, the configuration disclosed in the official gazette involves a problem in that a space for attaching the block-like terminal members 41 is required on the rear side of the peripheral part of the printed board 37 in place of lead terminals so as to disturb downsizing. Furthermore, in the case lead terminals conventionally used are used in place of the block-like terminal members 41, also a problem is involved in that a space for connecting the lead terminals is required so as to disturb downsizing.

SUMMARY OF THE INVENTION

In order to solve the problems, an object of the invention is to provide a surface mounting part, capable of corresponding to high density mounting of a mother board and capable of achieving a small size.

A first aspect of a surface mounting part comprises electronic parts on both sides of a printed board, wherein terminal electrodes of the electronic parts mounted on the rear side serve as the terminals to be connected with a mother board.

Since the terminal electrodes of the electronic parts mounted on the rear side serve also as the terminals for connecting with the outside of the surface mounting part, a space for attaching a connecting member for connecting the surface mounting part with the mother board is not required so as to enable downsizing of the printed board, that is, downsizing of the surface mounting part.

Preferably, the surface mounting part is a voltage controlled oscillator.

Since the structure of the first aspect is adopted in a voltage controlled oscillator, the voltage controlled oscillator can be downsized, and thus a mobile communication device comprising the same can be downsized as well.

Further, in the surface mounting part, a solder for connecting the printed board and the electronic parts mounted on the rear side is of a high melting temperature type, that is, a high melting point, which is different from the melting temperature of an eutectic solder for connecting with the mother board so as to prevent displacement of the electronic parts used as the terminal electrodes with respect to the printed board.

Furthermore, the terminal electrodes not connected with the mother board, provided in the electronic parts mounted on the rear side of the printed board having the terminals connected with the mother board, are covered with an insulating material.

Since the terminal electrodes not connected with the mother board are covered with an insulating material, insulation can be ensured without the risk of contacting with the conductor pattern on the mother board side.

Moreover, a space between the electronic parts mounted on the rear side of the printed board is filled with an insulating material.

In the case the surface mounting part is soldered on the mother board by reflow, since the solder for fixing the electronic parts on the printed board (in particular, on the rear side) may be melted, a solder having a higher melting point with respect to the solder for fixing the surface mounting part on the mother board is used for fixing the electronic parts on the printed board, displacement of the electronic parts can be prevented, and positioning and fixing can be facilitated.

In the case their melting points are close, the risk of melting is large. If the melting takes place, the electronic parts mounted on the printed board may be displaced. That is, since the pads of the mother board and the printed board are soldered with each other, displacement takes place toward a larger tensile force side. However, according to the configuration of the fourth aspect, wherein a space between the electronic parts mounted on the rear side of the printed board is filled with an insulating material, displacement of the electronic parts can be prevented, and positioning and fixing can be facilitated.

Still further, the electronic parts mounted on the rear side of the printed board have terminal electrodes on both ends, and the terminal electrodes on one end side are connected with the printed board, and the terminal electrodes on the other end are connected with the mother board.

Since the direction linking the terminals of the electronic parts having the terminals connected with the mother board among the electronic parts mounted on the rear side of the printed board is disposed perpendicular to the printed board, the terminal electrodes on the side not connected with the mother board can avoid the risk of contacting with the conductor pattern of the mother board.

DESCRIPTION OF THE PREFERRED EMBODIMENTS

Figure 1A:
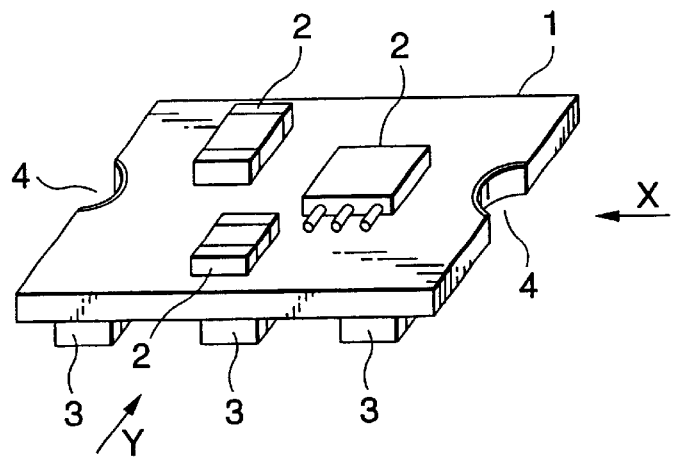
FIG. 1A is a perspective view of an embodiment of a surface mounting part according to the invention viewed from the front side.
Figure 1B:
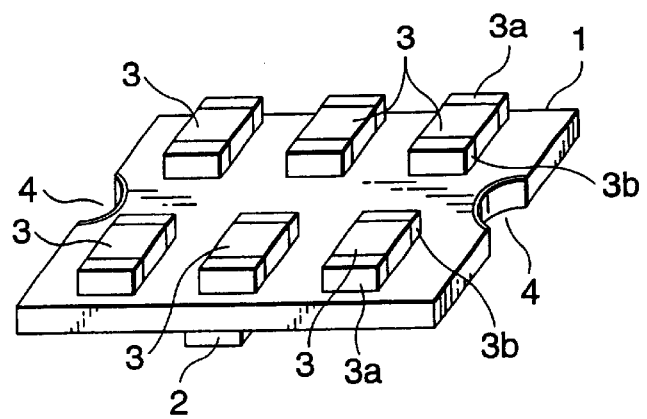
FIG. 1B is a perspective view of the surface mounting part viewed from the rear side.
Figure 1C:
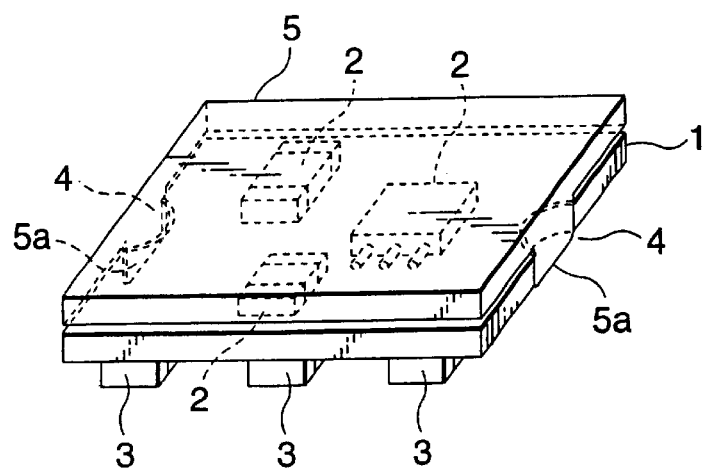
FIG. 1C is a perspective view of the surface mounting part in the state with a shield case attached.
Figure 2A:
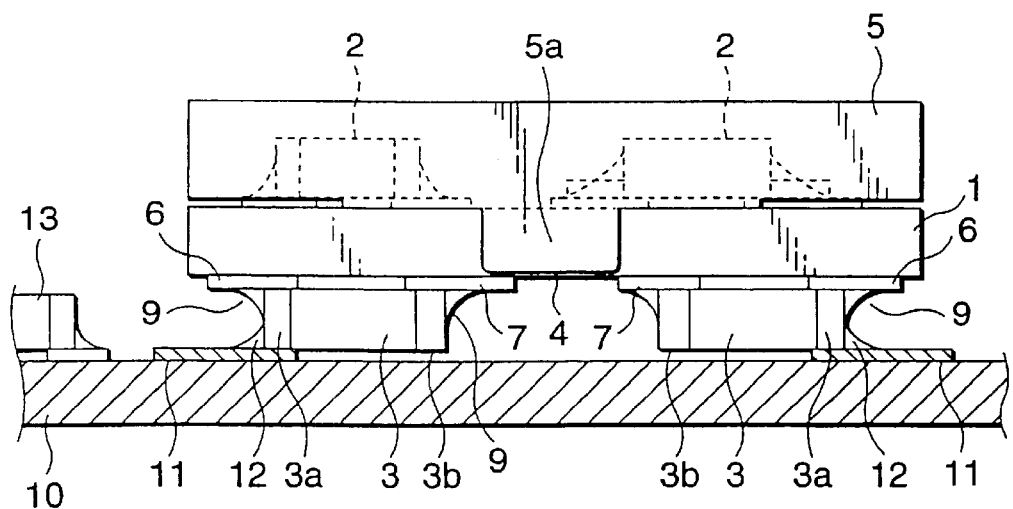
FIGS. 2A and 2B shows the state of the surface mounting part of FIGS. 1A to 1C mounted on the mother board, viewed from the X direction and the Y direction of FIG. 1A, respectively.
Figure 2B:
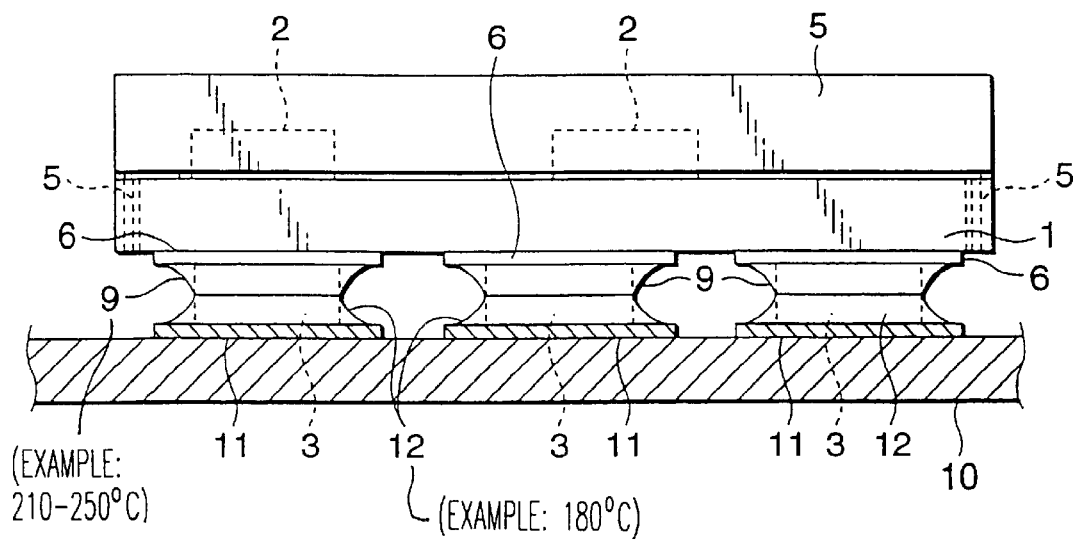

FIG. 1A is a perspective view of an embodiment of a surface mounting part according to the invention viewed from the front side; FIG. 1B is a perspective view of the surface mounting part viewed from the rear side; and FIG. 1C is a perspective view of the surface mounting part in the state with a shield case attached. Moreover, FIGS. 2A and 2B show the state of the surface mounting part mounted on the mother board, viewed from the X direction and the Y direction of FIG. 1A, respectively.

In FIGS. 1A to 2B, numeral 1 denotes a printed board. In this embodiment, a voltage controlled oscillator is presented as an example thereof. The printed board 1 has a multi-layer structure of a conductor and an insulator (including a dielectric substance, a magnetic substance and a non-magnetic substance) by a screen printing process or a sheet process so as to form a resonator, a capacitor, and a through hole for connection in the inside as well as to optionally form an inductor and a resistor in the inside, and a conductor pattern on the front and rear sides.

In addition to a semiconductor element such as a transistor, any one selected from the group consisting of a capacitor, an inductor and a resistor is mounted as an electronic part 2 on the surface of the printed board 1. An electronic part 3 comprising a capacitor is mounted on the rear side of the printed board 1, and furthermore, optionally either of a resistor or a inductor, or both of them may be mounted on the rear side.

Semi-circular arc-like terminals 4 are formed on both sides of the printed board 1 by cutting a through hole with a conductor film formed on the inner wall. A shield case 5 is fixed so as to cover the electronic parts 2 on the surface of the printed board 1 by fitting and soldering projection pieces 5a projecting downward, formed on the rim of the lower opening part of the shield case 5 with the semi-circular arc-like terminals 4.

As shown in FIGS. 2A and 2B, electronic parts (in this embodiment, capacitors) 3 are mounted on the rear side of the printed board 1. The electronic parts 3 are fixed by electrically connecting terminal electrodes 3a, 3b provided on both ends with pads 6, 7 of the printed board 1 by a solder 9. Then, the terminal electrodes 3a of the electronic parts 3 on one end are connected electrically with pads 11 formed on the mother board 10 so as to be fixed. Numeral 13 denotes an electronic part directly mounted on the mother board 10.

Electronic parts relatively unsusceptible to suffer the influence of a noise, such as a capacitor to be connected with an input terminal, an output terminal, and a power source terminal of a voltage controlled oscillator, and a capacitor having each one end connected with a ground as well as to be connected with an input or output pad, a power source supply pad or a ground pad on the mother board 10, are selected as these electronic parts 3. Moreover, the thickness of the plurality of the electronic parts 3 having the terminals 3a to be connected with the mother board 10 is set to have the lower surface thereof flush with each other.

Accordingly, by having the terminal electrodes 3a of the electronic parts 3 mounted on the rear side of the printed board 1 also serving as the terminals to be connected with the outside, a space for attaching a connecting member for connecting the surface mounting part 3 with the mother board, such as a lead terminal is not required so that downsizing of the printed board, that is, downsizing of the surface mounting part can be enabled. Moreover, since the printed board 1 having a multi-layer structure accommodates a part of or all of a resonator, a capacitor, an inductor, a resistor, a through hole for connection in the inside, the number of parts to be mounted can be reduced so that downsizing can be further facilitated as a whole.

Figure 4A:
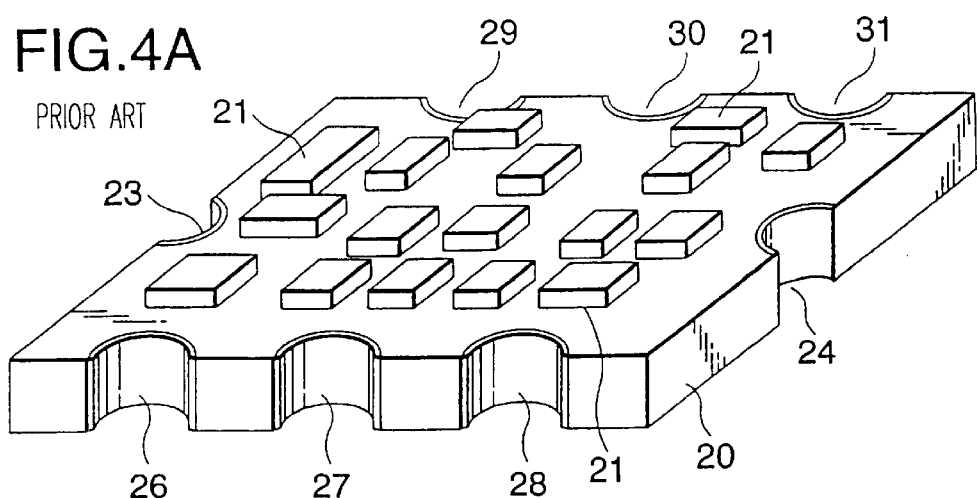
FIG. 4A is a perspective view showing a conventional surface mounting part.
Figure 4B:
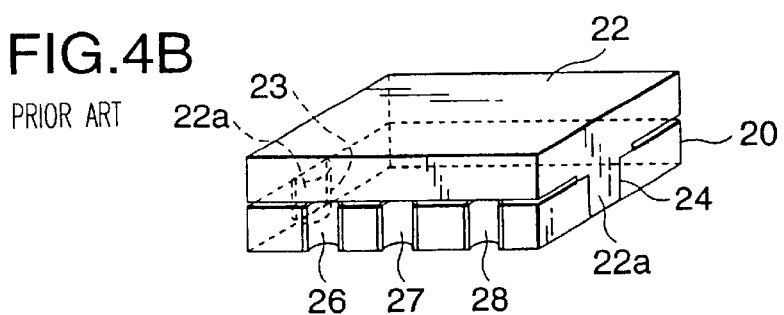
FIG. 4B is a perspective view showing the surface mounting part of FIG. 4A in the state with a shield case attached.
Figure 4C:
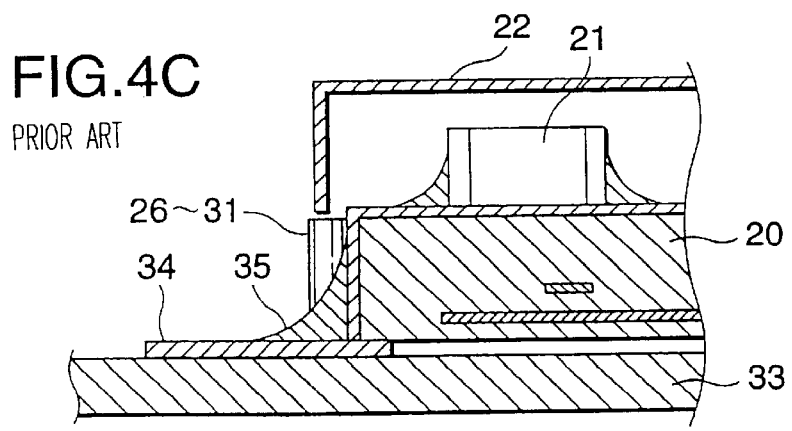
FIG. 4C is a cross-sectional view showing the mounting structure on the mother board.
Figure 4D:
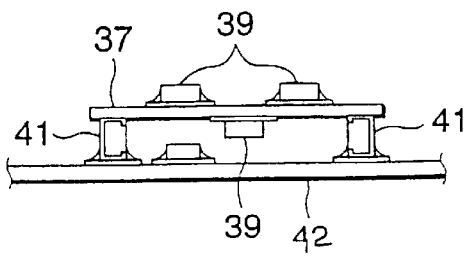
FIG. 4D is a side view showing a known surface mounting part in the mounted state.

Furthermore, as shown in FIG. 4A, compared with the conventional example with the electronic parts mounted only on one side, that is, the conventional example needs to have a large number of the terminals for connecting with the outside 26 to 31 in the periphery of the board whereas they are not required in the case of the invention so that in addition to downsizing by allotting the electronic parts onto the front and rear sides, a space required can further be smaller, and thus compared with the conventional example shown in FIG. 4A, the area of the printed board 1 can be made smaller to about 47% according to the invention.

Figure 3A:
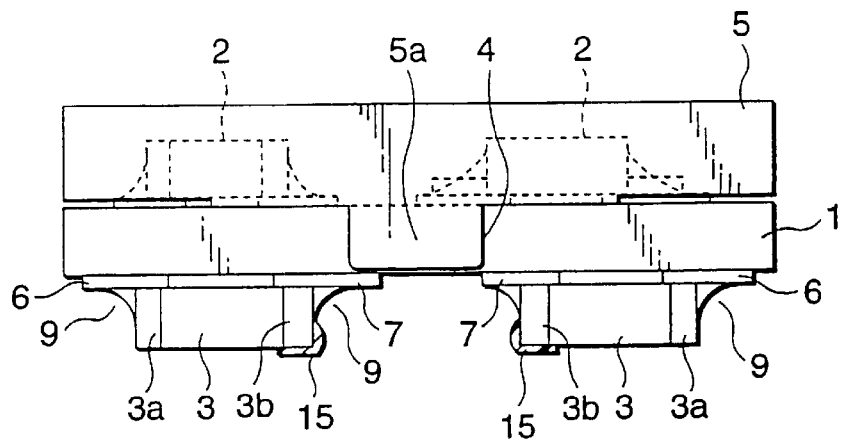
FIG. 3A is a side view of another embodiment of the invention.

FIG. 3A is a side view of a surface mounting part according to another embodiment of the invention. As mentioned above, in the case only the terminal electrodes 3a on one end out of the plurality of the terminals 3a, 3b to be connected and fixed with the printed board 1, are used as the connection terminals with the mother board 10, the terminal electrodes 3b not to be used as the connection terminals with the mother board 10 are covered with an insulating material 15, such as an insulating resin, at least on the mother board 10 side.

The solder at which the terminals of the electronic parts and the printed board of the surface mounting part are connected in FIGS. 2A, 2B, 3A, 3B and 3C (see especially element 9 in FIGS. 2B and 3C), has a higher melting point than an eutectic solder (see especially element 12 in FIGS. 2B and 3C) for fixing the surface mounting part on the mother board. For example, the solder 9 has the higher melting point at about 210° C. to 250° C., while the eutectic solder 12 has the lower melting point about 180° C.

Accordingly, by covering the terminal electrodes 3b not to be used as the connection terminals with the mother board 10 are covered with the insulating material 15, insulation can be ensured without the risk of contacting with the mother board side conductor pattern.

Figure 3B:
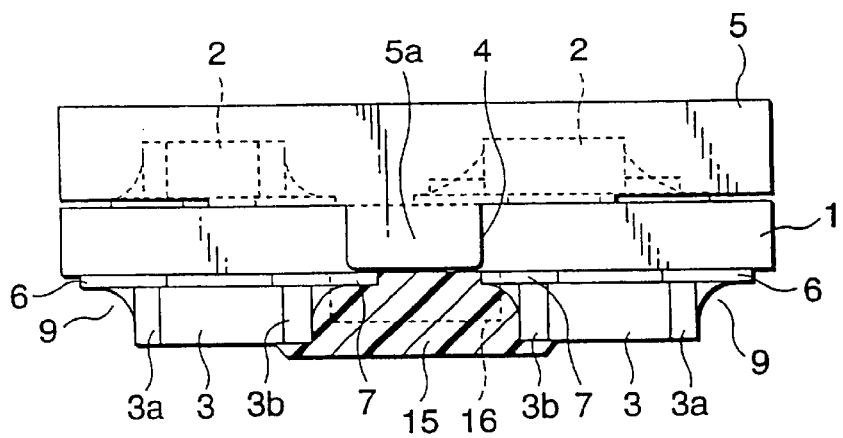
FIG. 3B is a side view of a modified embodiment of FIG. 3A.

FIG. 3B shows a modified embodiment of FIG. 3A. In addition to the terminal electrodes 3b, a space between the electronic parts 3 having the terminal electrodes 3a to be connected with the mother board 10 is covered with the insulating material 15, such as an insulating resin. According to the configuration, in the case an electronic part 16 having only a terminal not to be connected with the mother board 10 is provided on the rear side of the printed board 1, contact of the electronic part 16 and the conductor pattern of the mother board 10 can be prevented. Moreover, since the space between the electronic parts 3 on the rear side of the printed board 1 is filled with the insulating material 15, displacement of the electronic parts 3 caused by melting of the solder which fixes the electronic parts 3 on the printed board 1 at the time of mounting the surface mounting part onto the mother board 10 by reflow can be prevented so as to facilitate positioning and fixing.

The electronic part 16 having a terminal not to be connected with the mother board 10 has a thickness set to be smaller than that of the electronic parts 3.

Figure 3C:
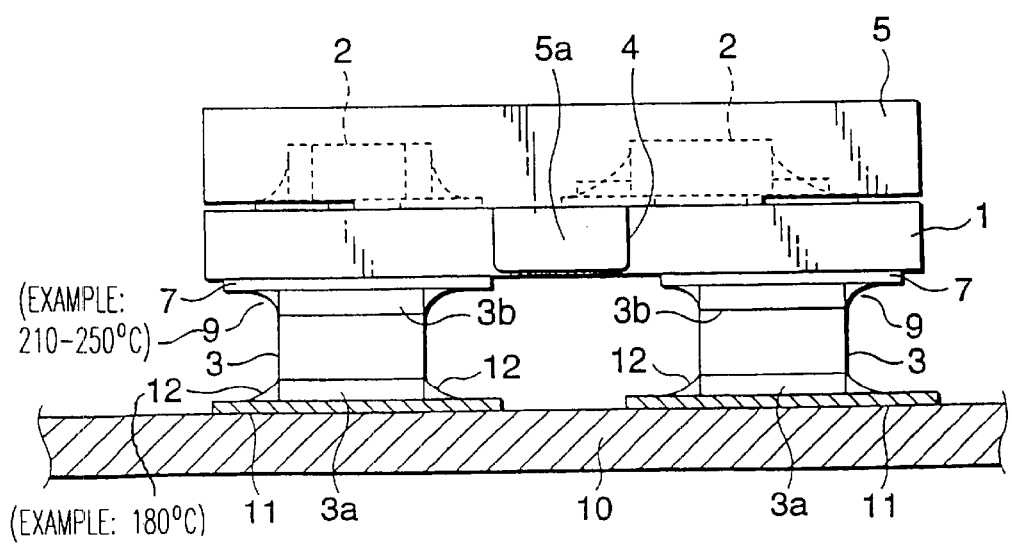
FIG. 3C is a side view of another embodiment of the invention.

FIG. 3C shows another embodiment of a surface mounting part of the invention. In this embodiment, the electronic parts 3 mounted on the rear side of the printed board 1 and connected with the mother board 10 comprise the terminal electrodes 3a, 3b on both ends, with the terminal electrodes 3b connected with pads 7 of the printed board 1, and the terminal electrodes 3a on the other end connected with pads 11 of the mother board 10.

Accordingly, since the direction linking the terminals 3a, 3b of the electronic parts 3 having the terminals 3a connected with the mother board among the electronic parts 3 mounted on the rear side of the printed board 1 is disposed perpendicular to the printed board 1, the terminal electrodes 3b on the side not connected with the mother board 10 can avoid the risk of contacting with the conductor pattern of the mother board 10. Therefore, an insulating material needs not be provided for covering the terminal electrodes 3b on the printed board 1 side.

The invention can be adopted not only to a voltage controlled oscillator, but also various kinds of modules with a relatively large number of parts, such as an active filter.

According to the invention, since the surface mounted part comprises electronic parts on both sides of a printed board, and terminal electrodes of the electronic parts mounted on the rear side serve as the terminals to be connected with a mother board, so that the electronic parts can be allotted on the front and rear sides of the printed board as well as a space for attaching a connecting member for connecting the surface mounting part with the mother board is not required, downsizing of the printed board, that is, downsizing of the surface mounting part can be enabled.

Further, according to the invention, since the structure of the first aspect is adopted in a voltage controlled oscillator, the voltage controlled oscillator can be downsized, and thus a mobile communication device comprising the same can be downsized as well.

In the case the surface mounting part is soldered on the mother board by reflow, since the solder for fixing the electronic parts on the printed board (in particular, on the rear side) may be melted, a solder having a higher melting point with respect to the solder for fixing the surface mounting part on the mother board is used for fixing the electronic parts on the printed board, displacement of the electronic parts can be prevented, and positioning and fixing can be facilitated.

Furthermore, according to the invention, since terminal electrodes not connected with the mother board, provided in the electronic parts mounted on the rear side of the printed board having the terminals connected with the mother board, are covered with an insulating material, insulation can be ensured without the risk of contacting with the conductor pattern on the mother board side.

Moreover, according to the invention, since a space between the electronic parts mounted on the rear side of the printed board is filled with an insulating material, the insulating material can serve as a fixing material so that displacement of the electronic parts caused by melting of the solder which fixes the electronic parts on the printed board at the time of mounting the surface mounting part on the mother board can be prevented, and positioning and fixing can be facilitated.

Moreover, according to the invention, since the electronic parts mounted on the rear side of the printed board have terminal electrodes on both ends, and the terminal electrodes on one end side are connected with the printed board, and the terminal electrodes on the other end are connected with the mother board, the terminal electrodes on the side not connected with the mother board can avoid the risk of contacting with the conductor pattern of the mother board.

What is claimed is:

1. A surface mounting part comprising:
   a printed board;
   a first group of electronic parts mounted on a first side of said printed board; and
   a second group of electronic parts mounted on a second side of said printed board, the electronic parts in the second group including terminal electrodes that serve as terminals to be connected with a mother board; wherein:
   a solder for connecting the printed board and the electronic parts mounted on the second side has a high melting temperature, and
   an eutectic solder for connecting the electric parts mounted on the second side with the mother board has a melting temperature lower than that of said solder, so as to prevent displacement of the electronic parts with respect to the printed board.

2. The surface mounting part according to claim 1, wherein the surface mounting part is a voltage controlled oscillator.

3. The surface mounting part according claim 1, wherein terminal electrodes not connected with the mother board, provided in the electronic parts mounted on the second side of the printed board having the terminal electrodes connected with the mother board, are covered with an insulating material.

4. The surface mounting part according to claim 1, wherein a space between the electronic parts mounted on the second side of the printed board is filled with an insulating material.

5. The surface mounting part according to claim 1, wherein:

the electronic parts mounted on the second side of the printed board have terminal electrodes on both ends, and the terminal electrodes on one end are connected with the printed board, and the terminal electrodes on the other end are connected with the mother board.

6. The surface mounting part according to claim 5, wherein:

the terminal electrodes on one end are connected with the printed board and not with the mother board, and the terminal electrodes on the other end are connected with the mother board and not with the printed board.

7. A surface mounting part comprising:

a printed board;

a first group of electronic parts mounted on a first side of said printed board; and a second group of electronic parts mounted on a second side of said printed board, the electronic parts in the second group including terminal electrodes that serve as terminals to be connected with a mother board; wherein:

the electronic parts mounted on the second side of the printed board have terminal electrodes on both ends;

the terminal electrodes on one end are connected with the printed board and not with the mother board; and the terminal electrodes on the other end are connected with the mother board and not with the printed board.

8. The surface mounting part according to claim 7, wherein the surface mounting part is a voltage controlled oscillator.

9. The surface mounting part according to claim 7, wherein:

a solder for connecting the printed board and the electronic parts mounted on the second side has a high melting temperature, and an eutectic solder for connecting the electric parts mounted on the second side with the mother board has a melting temperature lower than that of said solder, so as to prevent displacement of the electronic parts with respect to the printed board.

10. The surface mounting part according claim 7, wherein terminal electrodes not connected with the mother board, provided in the electronic parts mounted on the second side of the printed board having the terminal electrodes connected with the mother board, are covered with an insulating material.

11. The surface mounting part according to claim 7, wherein a space between the electronic parts mounted on the second side of the printed board is filled with an insulating material.

* * * * *